United States Patent
Hsu et al.

(10) Patent No.: US 10,529,876 B2
(45) Date of Patent: Jan. 7, 2020

(54) INFRARED SENSOR AND MANUFACTURING METHOD THEREOF

(71) Applicant: INDUSTRIAL TECHNOLOGY RESEARCH INSTITUTE, Hsinchu (TW)

(72) Inventors: Feng-Chia Hsu, Kaohsiung (TW); Shing-Cheng Chang, Kaohsiung (TW); Peng-Jen Chen, Kaohsiung (TW); Chung-Yuan Su, Tainan (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 118 days.

(21) Appl. No.: 15/856,925

(22) Filed: Dec. 28, 2017

(65) Prior Publication Data

US 2019/0172958 A1 Jun. 6, 2019

(30) Foreign Application Priority Data

Dec. 1, 2017 (TW) ................. 106142271

(51) Int. Cl.
*H01L 27/146* (2006.01)
*H01L 31/0236* (2006.01)
*H01L 35/32* (2006.01)
*G01J 5/00* (2006.01)

(52) U.S. Cl.
CPC .......... *H01L 31/02366* (2013.01); *G01J 5/00* (2013.01); *H01L 27/14649* (2013.01); *H01L 27/14687* (2013.01); *H01L 35/32* (2013.01)

(58) Field of Classification Search
CPC ......... H01L 31/02366; H01L 27/14649; H01L 27/14687
See application file for complete search history.

(56) References Cited

U.S. PATENT DOCUMENTS

| | | | |
|---|---|---|---|
| 5,426,303 | A | 6/1995 | Owen et al. |
| 5,457,318 | A | 10/1995 | Robinson et al. |
| 5,626,773 | A | 5/1997 | Belcher et al. |
| 5,647,946 | A | 7/1997 | Belcher et al. |
| 5,792,377 | A | 8/1998 | Belcher et al. |
| 5,912,464 | A | 6/1999 | Vilain et al. |
| 6,194,722 | B1 | 2/2001 | Fiorini et al. |

(Continued)

FOREIGN PATENT DOCUMENTS

| CN | 1255970 A | 6/2000 |
|---|---|---|
| CN | 2766254 Y | 3/2006 |

(Continued)

OTHER PUBLICATIONS

Mottin et al., "Uncooled amorphous silicon technology enchancement for 25μm pixel pitch achievement," Proceedings of SPIE, vol. 4820 (2003) pp. 200-207.

(Continued)

*Primary Examiner* — Douglas M Menz
(74) *Attorney, Agent, or Firm* — Muncy, Geissler, Olds & Lowe, P.C.

(57) ABSTRACT

An infrared sensor including a substrate, an infrared absorption layer and a concave is provided. The infrared absorption layer is formed on a substrate and has a sensing surface. The concave extends toward the substrate from a sensing surface of the infrared absorption layer.

13 Claims, 10 Drawing Sheets

(56) References Cited

U.S. PATENT DOCUMENTS

| | | |
|---|---|---|
| 7,655,909 B2 | 2/2010 | Schimert et al. |
| 7,667,200 B1 | 2/2010 | Watts et al. |
| 7,815,860 B2 | 10/2010 | Kim et al. |
| 8,217,480 B2 | 7/2012 | Ting et al. |
| 8,664,510 B2 | 3/2014 | Ojima et al. |
| 9,171,885 B2 | 10/2015 | Nam et al. |
| 9,335,217 B2 | 5/2016 | Pisano et al. |
| 2001/0055833 A1 | 12/2001 | Fiorini et al. |
| 2005/0012040 A1 | 1/2005 | Fiorini et al. |
| 2006/0205060 A1 | 9/2006 | Kim et al. |
| 2007/0145274 A1 | 6/2007 | Iida |
| 2009/0266987 A1* | 10/2009 | Honda .................. G01J 5/02 250/338.4 |
| 2012/0061791 A1 | 3/2012 | Atsuta et al. |
| 2014/0246749 A1 | 9/2014 | Nam et al. |
| 2014/0326883 A1 | 11/2014 | Abdolvand et al. |
| 2015/0362374 A1 | 12/2015 | Wheeler et al. |

FOREIGN PATENT DOCUMENTS

| | | |
|---|---|---|
| CN | 102197290 A | 9/2011 |
| CN | 101835624 B | 10/2012 |
| CN | 102822745 A | 12/2012 |
| CN | 103759838 A | 4/2014 |
| CN | 106206830 A | 12/2016 |
| EP | 0680101 B1 | 11/1999 |
| EP | 0721226 B1 | 5/2000 |
| EP | 0867702 B1 | 3/2003 |
| EP | 1096240 B1 | 2/2008 |
| EP | 2348294 A1 | 7/2011 |
| TW | 346688 B | 12/1998 |
| TW | I473982 B | 2/2015 |

OTHER PUBLICATIONS

Peng et al., "Broadband and highly absorbing multilayer structure in mid-infrared," Applied Optics, vol. 55, No. 31, Nov. 1, 2016, 6 pages.

Liu et al., "Infrared Perfect Absorber and Its Application As Plasmonic Sensor," Nano Letters, American Chemical Society, 2010, vol. 10, pp. 2342-2348.

Kang et al., "Ultra Narrowband Infrared Absorbers for Omni-Directional and Polarization Insensitive Multi-Spectral Sensing Microsystems," Transducers 2017, Jun. 18-22, 2017, pp. 886-889.

Lu et al., "CMOS micromachined structures using transistors in the subthreshold region for thermal sensing," Journal of Micromechanics and Microengineering, vol. 16, 2006, pp. 1734-1739.

Dong et al., Fabrication and Characterization of Integrated Uncooled Infrared Sensor Arrays Using a-Si Thin-Film Transistors as Active Elements, Journal of Microelectromechanical Systems, vol. 14, No. 5, Oct. 2005, pp. 1167-1177.

* cited by examiner

INFRARED SENSOR AND MANUFACTURING METHOD THEREOF

This application claims the benefit of Taiwan application Serial No. 106142271, filed Dec. 1, 2017, the subject matter of which is incorporated herein by reference.

BACKGROUND OF THE INVENTION

Field of the Invention

The disclosure relates in general to an infrared sensor and a manufacturing method thereof, and an infrared sensor with concaves and a manufacturing method thereof.

Description of the Related Art

A general infrared sensor can collect an infrared energy irradiated from an object under test and then focus the collected energy on a detector. Then, the detector converts the energy into an electric signal, which is further amplified and displayed as a temperature reading. Generally speaking, the detector includes a thermal layer and an infrared absorption layer. The infrared absorption layer entirely and completely covers the thermal layer. The infrared absorption layer absorbs the infrared energy irradiated from the object under test. After sensing an infrared energy, the thermal layer converts the infrared energy (heat) into an electric signal. Then, the processor calculates the temperature value of the object under test according to the electric signal.

However, such layer structure is unable to meet the requirements of having a shorter response time and a lower signal to noises ratio (SNR). Therefore, the industries in the technology field of the invention need to provide a new infrared sensor having a shorter response time and a lower SNR to meet the requirements.

SUMMARY OF THE INVENTION

The disclosure is directed to an infrared sensor and a manufacturing method thereof capable of resolving the generally known problems disclosed above.

According to one embodiment of the disclosure, an infrared sensor including a substrate, an infrared absorption layer and a concave is provided. The infrared absorption layer is formed on a substrate and has a sensing surface. The concave extends toward the substrate from a sensing surface of the infrared absorption layer.

According to another embodiment of the disclosure, a manufacturing method of an infrared sensor is provided. The manufacturing method includes the following steps. A substrate and an infrared absorption layer are provided, wherein the infrared absorption layer is formed on the substrate and has a sensing surface. A concave is formed, wherein the concave extends toward the substrate from the sensing surface of the infrared absorption layer.

The above and other aspects of the disclosure will become better understood with regard to the following detailed description of the preferred but non-limiting embodiment(s). The following description is made with reference to the accompanying drawings.

DETAILED DESCRIPTION OF THE INVENTION

Figure 1A:
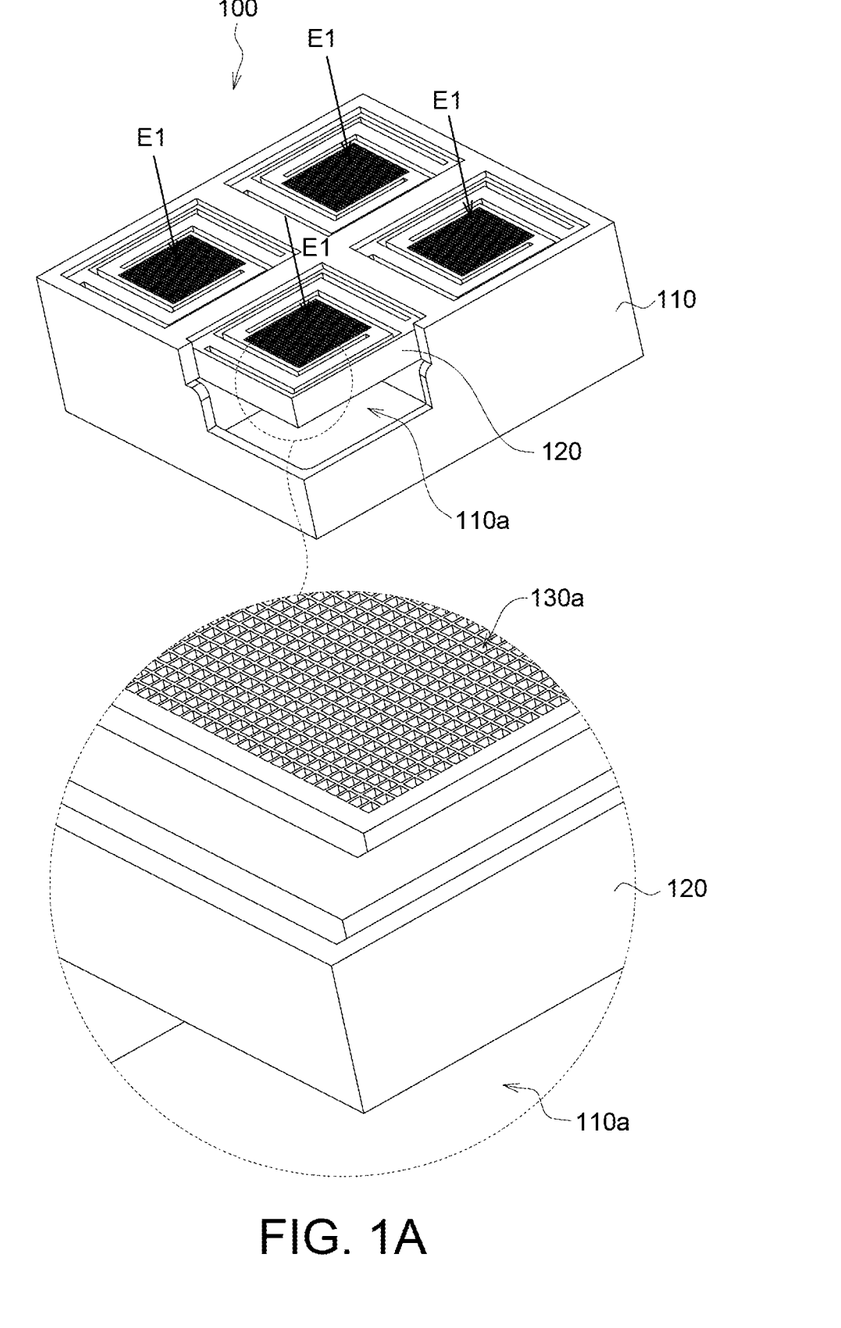
FIG. 1A is a schematic diagram of an infrared sensor according to an embodiment of the disclosure.
Figure 1B:
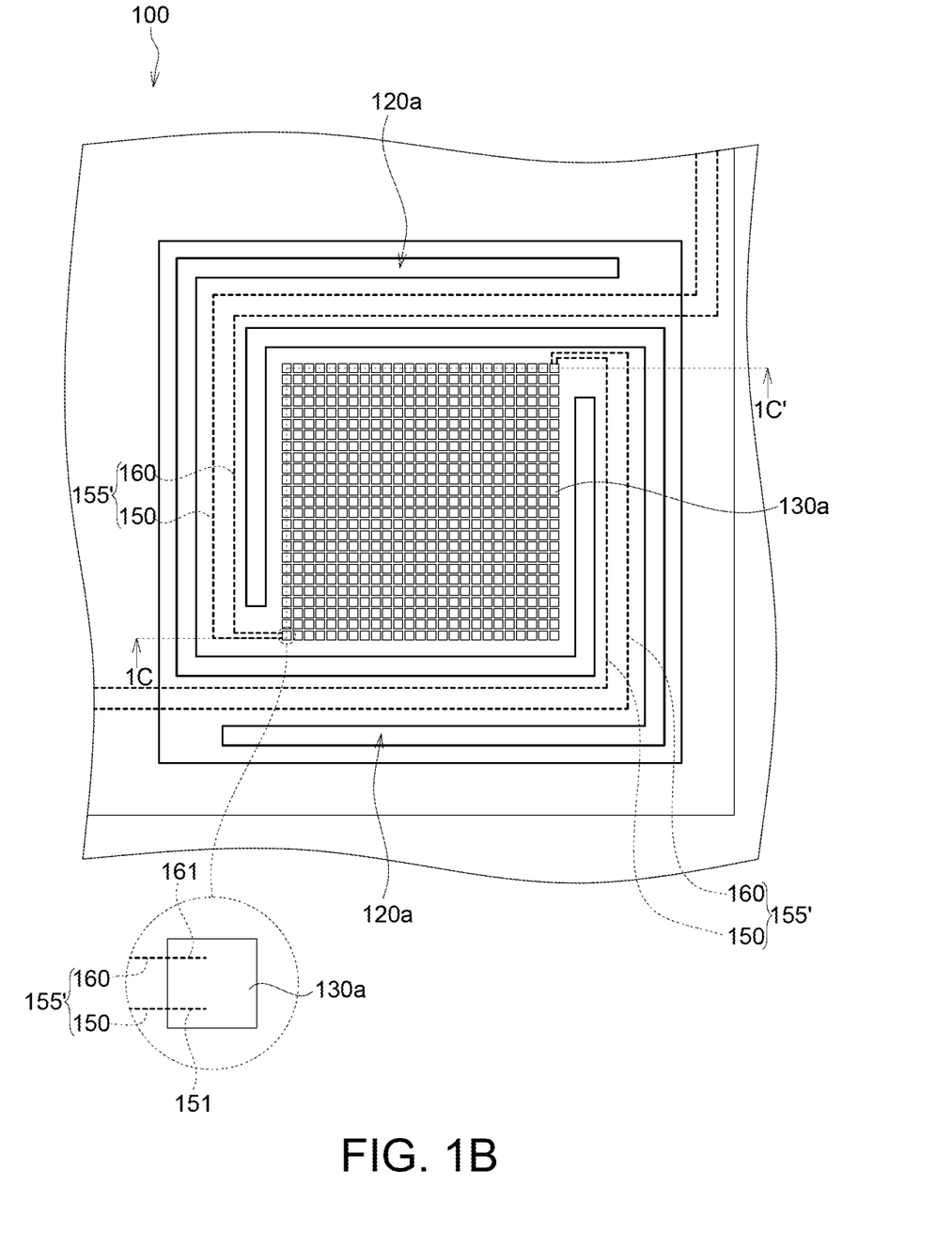
FIG. 1B is a partial top view of the infrared sensor of FIG. 1A.
Figure 1C:
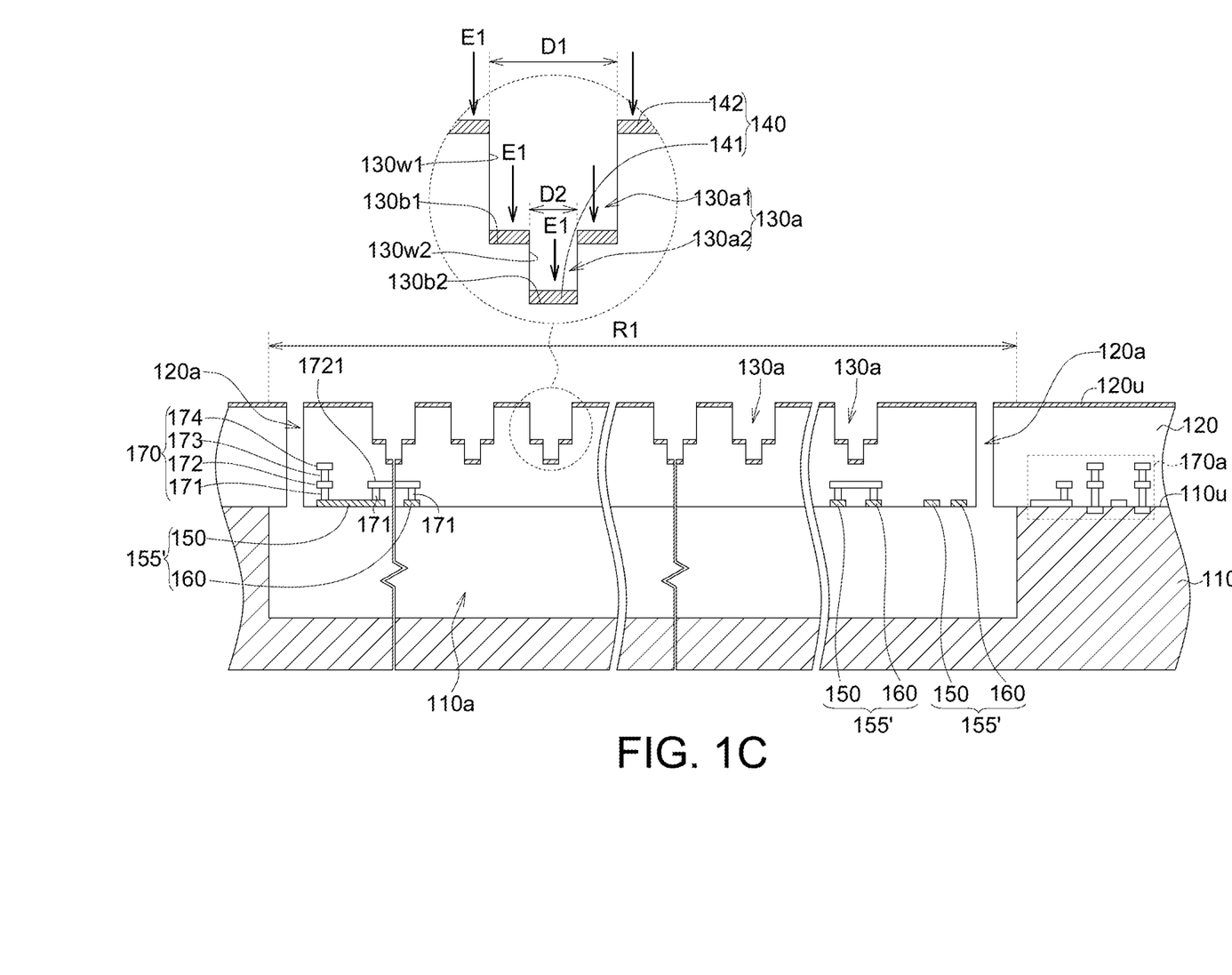
FIG. 1C is a cross-sectional view along a direction 1C-1C' of the infrared sensor of FIG. 1B.

Refer to FIGS. 1A~1C. FIG. 1A is a schematic diagram of an infrared sensor 100 according to an embodiment of the disclosure. FIG. 1B is a partial top view of the infrared sensor 100 of FIG. 1A. FIG. 1C is a cross-sectional view along a direction 1C-1C' of the infrared sensor 100 of FIG. 1B.

The infrared sensor 100 collects an infrared energy E1 irradiated from an object under test, converts the infrared energy E1 into an electric signal, and calculates a temperature value of the object under test according to the electric signal.

The infrared sensor 100 includes a substrate 110, an infrared absorption layer 120, at least one concave 130a, a thermal conduction layer 140, at least one thermoelectric element 155', and a semiconductor structure layer 170.

The infrared absorption layer 120 is formed on an upper surface 110u of the substrate 110 and has a sensing surface 120u. The concave 130a extends towards the substrate 110 from the sensing surface 120u of the infrared absorption layer 120. In comparison to the infrared sensor without any concaves 130a, the inner sidewall of the concave 130a of the present embodiment provides additional sensing area, and therefore effectively increases the radiation absorption rate, shortens the response time and decreases the SNR of the infrared sensor 100. Besides, the substrate 110 can be realized by a silicone substrate, and the infrared absorption layer 120 can be realized by an oxide layer, such as a silicon oxide layer.

As indicated in FIG. 1C, each concave 130a includes a first groove 130a1 and a second groove 130a2, wherein the first groove 130a1 extends to the second groove 130a2 from the sensing surface 120u, and the diameter D1 of the first groove 130a1 is different from the diameter D2 of the second groove 130a2. For example, the diameter D1 of the first groove 130a1 is larger than the diameter D2 of the second groove 130a2, so that the concave 130a is wider at the top but narrower at the bottom. However, in another embodiment, the diameter D2 of the second groove 130a2 can be larger the diameter D1 of than the first groove 130a1, so that the concave 130a is narrower at the top but wider at the bottom. In the embodiments of the disclosure, the shape of the concave is not subjected to any restrictions.

Moreover, each concave 130a has a bottom wall and a sidewall, wherein the bottom wall and/or the sidewall can be a plane wall, a curved wall or a combination thereof. As indicated in FIG. 1C, both the bottom wall 130b1 and the sidewall 130w1 of the first groove 130a1 are plane walls, and both the bottom wall 130b2 and the sidewall 130w2 of the second groove 130a2 are plane walls as well. In another embodiment, the bottom wall 130b1, the sidewall 130w1, the bottom wall 130b2 and/or the sidewall 130w2 can be curved walls, plane walls or a combination thereof.

The thermal conduction layer 140 is formed on at least one portion of the entire wall surface of the concave 130a and at least one portion of the sensing surface 120u to absorb an infrared energy E1, so that the infrared sensor 100 can have better absorption efficiency of the infrared energy E1. As indicated in FIG. 1C, the thermal conduction layer 140 includes a first sub-thermal conduction layer 141 and a second sub-thermal conduction layer 142. The first sub-thermal conduction layer 141 is formed on the bottom wall 130b1 of the first groove 130a1 and the bottom wall 130b2 of the second groove 130a2. The second sub-thermal conduction layer 142 is formed on the sensing surface 120u. The bottom wall 130b1, the bottom wall 130b2 and the sensing surface 120u all face an incident direction of the infrared energy E1, and therefore have a larger area or a largest area for absorbing the infrared energy E1. In another embodiment, the first sub-thermal conduction layer 141 is formed on the sidewall 130w1 of the first groove 130a1 and/or the sidewall 130w2 of the second groove 130a2. Furthermore, the thermal conduction layer 140 can be realized by a metal layer form of a material having excellent performance in thermal conduction. For example, the thermal conduction layer 140 is formed of a metal such as copper (Cu), nickel chromium (NiCr), titanium nitride (TiN), titanium (Ti) or gold (Au), and has a thickness substantially equivalent to or smaller than 100 nanometers.

As indicated in FIG. 1A~1C, the infrared absorption layer 120 includes multiple sensing blocks R1 (illustrated in FIG. 1C). Multiple concaves 130a and multiple penetrating portions 120a are located in corresponding sensing blocks R1 which can be arranged as an array or randomly. The multiple concaves 130a located in a sensing block R1 can be arranged as an array or arranged randomly.

The temperature change of each sensing block R1 is converted into an electric signal by two sets of thermoelectric element 155'. The electric signal is transmitted to a processor (not illustrated) for subsequent processing. The processor calculates a temperature value corresponding to the electric signal. Each thermoelectric element 155' can be realized by a thermopile, a transistor, a diode or a thermistor. In the present embodiment, each thermoelectric element 155' includes a first thermosensitive line 150 and a second thermosensitive line 160. The first end 151 of the first thermosensitive line 150 (the first end 151 is illustrated in FIG. 1B) and the first end 161 of the second thermosensitive line 160 (the first end 161 is illustrated in FIG. 1B) both are located under the concave 130a for sensing the infrared energy E1 absorbed by the infrared absorption layer 120 and converting the infrared energy E1 into an electric signal. In an embodiment, one of the first thermosensitive line 150 and the second thermosensitive line 160 is formed of n-type polysilicon (n-poly), and the other is formed of p-type polysilicon (p-poly). The first thermosensitive line 150 and the second thermosensitive line 160 can convert a thermal signal into an electric signal, such as a voltage difference.

As indicated in FIG. 1C, the first end 151 of the first thermosensitive line 150 and the first end 161 of the second thermosensitive line 160 both are located right under the concave 130a, so that the heat transfer path from the first end 151 and the first end 161 to the concave 130a is the shortest. In another embodiment, one of the first end 151 of the first thermosensitive line 150 and the first end 161 of the second thermosensitive line 160 is located right under the concave 130a, but the other is not located right under the concave 130a. Or, both the first end 151 and the first end 161 are not located right under the concave 130a. In other words, in the embodiment of the disclosure, the positions of the first end 151 and the first end 161 are not subjected to any restrictions, and any positions will do as long as the first end 151 and the first end 161 are adjacent to the concave 130a.

Besides, the second end of the first thermosensitive line 150 and the second end of the second thermosensitive line 160 (not illustrated) extends to the processor for transmitting the electric signal to the processor.

As indicated in FIG. 1C, the substrate 110 has multiple cavities 110a each extending towards the interior of the substrate 110 from the penetrating portion 120a, for example, from a lower edge of the penetrating portion 120a. The cavities 110a are filled with air which provides an insulation effect, so that the thermal conductivity can be reduced, and the infrared energy E1 absorbed by the infrared absorption layer 120 will not be transferred to the exterior of the infrared sensor 100 too quickly. If the infrared energy E1 absorbed by the infrared absorption layer 120 is transferred to the exterior of the infrared sensor 100 too quickly, the reading of the temperature value will be lower than the actual temperature of the object under test. That is, the design of the cavity 110a increases the accuracy of temperature measurement of the infrared sensor 100.

As indicated in FIG. 1C, the infrared absorption layer 120 has multiple penetrating portions 120a each extending to the cavity 110a from the sensing surface 120u and surrounding multiple concaves 130a. Each penetrating portion 120a substantially extends along the first thermosensitive line 150 and the second thermosensitive line 160. Each penetrating portion 120a extends to form the shape of an open ring, such as an L shape, hence avoiding the first thermosensitive line 150 and the second thermosensitive line 160 being broken up. Each penetrating portion 120a creates an accommodation space for the air. The accommodation space reduces the thermal conductivity, and achieves a technical effect similar to that of the cavity 110a.

As indicated in FIG. 1C, the semiconductor structure layer 170 includes at least one first conducting hole 171, a first conducting layer 172, at least one second conducting hole 173 and a second conducting layer 174. The first conducting hole 171 electrically connects the first conducting layer 172 to the first thermosensitive line 150 and the second thermosensitive line 160. For example, the first conducting layer 172 includes a connection member 1721. One of the first conducting holes 171 connects the first thermosensitive line 150 to the connection member 1721, and the other one of the first conducting holes 171 connects the second thermosensitive line 160 to the connection member 1721, so that the electric signals of the first thermosensitive line 150 and the second thermosensitive line 160 can be transmitted to the connection member 1721 of the first conducting layer 172 through the first conducting holes 171.

The second conducting holes 173 electrically connect the second conducting layer 174 to the first conducting layer 172, so that the electric signals of the first thermosensitive line 150 and the second thermosensitive line 160 can be transmitted to the second conducting layer 174 through the second conducting holes 173. The second conducting layer 174 extends to the processor (not illustrated), so that the electric signals of the first thermosensitive line 150 and the second thermosensitive line 160 can be transmitted to the processor. The processor calculates corresponding temperature values according to the received electric signals.

As indicated in FIG. 1C, the semiconductor structure layer 170 includes at least one electrical element 170a, such as a metal oxide semiconductor field effect transistor, a startup circuit, and/or other related circuit structures. The electrical element 170a is integrated in the infrared sensor 100 and provides functions other than the function of sensing the infrared energy, so that the functions and applications of the infrared sensor 100 can be expanded. Moreover, the electrical element 170a can be formed of partial structures of the first conducting holes 171, the first conducting layer 172, the second conducting holes 173 and the second conducting layer 174. Also, the processor can be realized by a part of the semiconductor structure layer 170 and can be formed of partial structures of the first conducting holes 171, the first conducting layer 172, the second conducting holes 173 and the second conducting layer 174.

Figure 2:
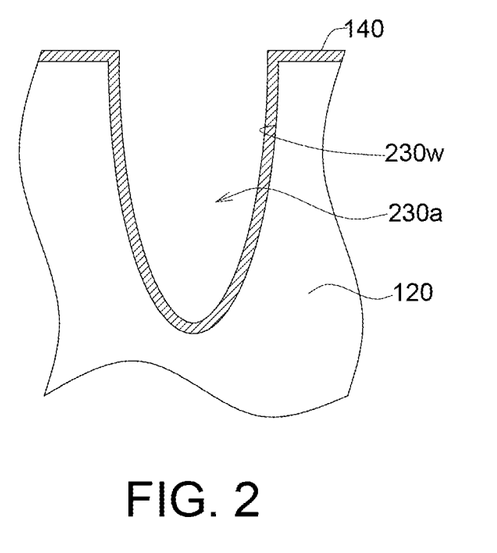
FIG. 2 is a schematic diagram of a concave according to another embodiment of the disclosure.

FIG. 2 is a schematic diagram of a concave 230a according to another embodiment of the disclosure. In the present embodiment, the sidewall 230w of the concave 230a is a curved wall, and can be realized by a portion of an ellipse, a portion of a circle, or an arc. The thermal conduction layer 140 can be formed on the sidewall 230w in conformity with the shape of the sidewall 230w of the concave 230a.

Figure 3:
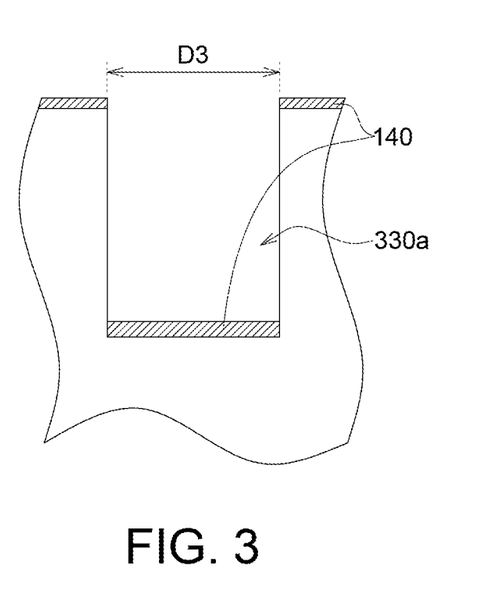
FIG. 3 is a schematic diagram of a concave according to another embodiment of the disclosure.

FIG. 3 is a schematic diagram of a concave 330a according to another embodiment of the disclosure. In comparison to the concave 130a disclosed above, the concave 330a of the present embodiment is a straight concave having a consistent diameter D3 rather than a stepped concave.

In other embodiments, the concave can have other geometric shapes. For example, the concave can be a triangular cone hole, a trapezoidal hole or a semi-circular hole, and the concaves used in the embodiments of the disclosure can have any shapes as long as the concave is capable of absorbing the infrared energy E1.

Figure 4A:
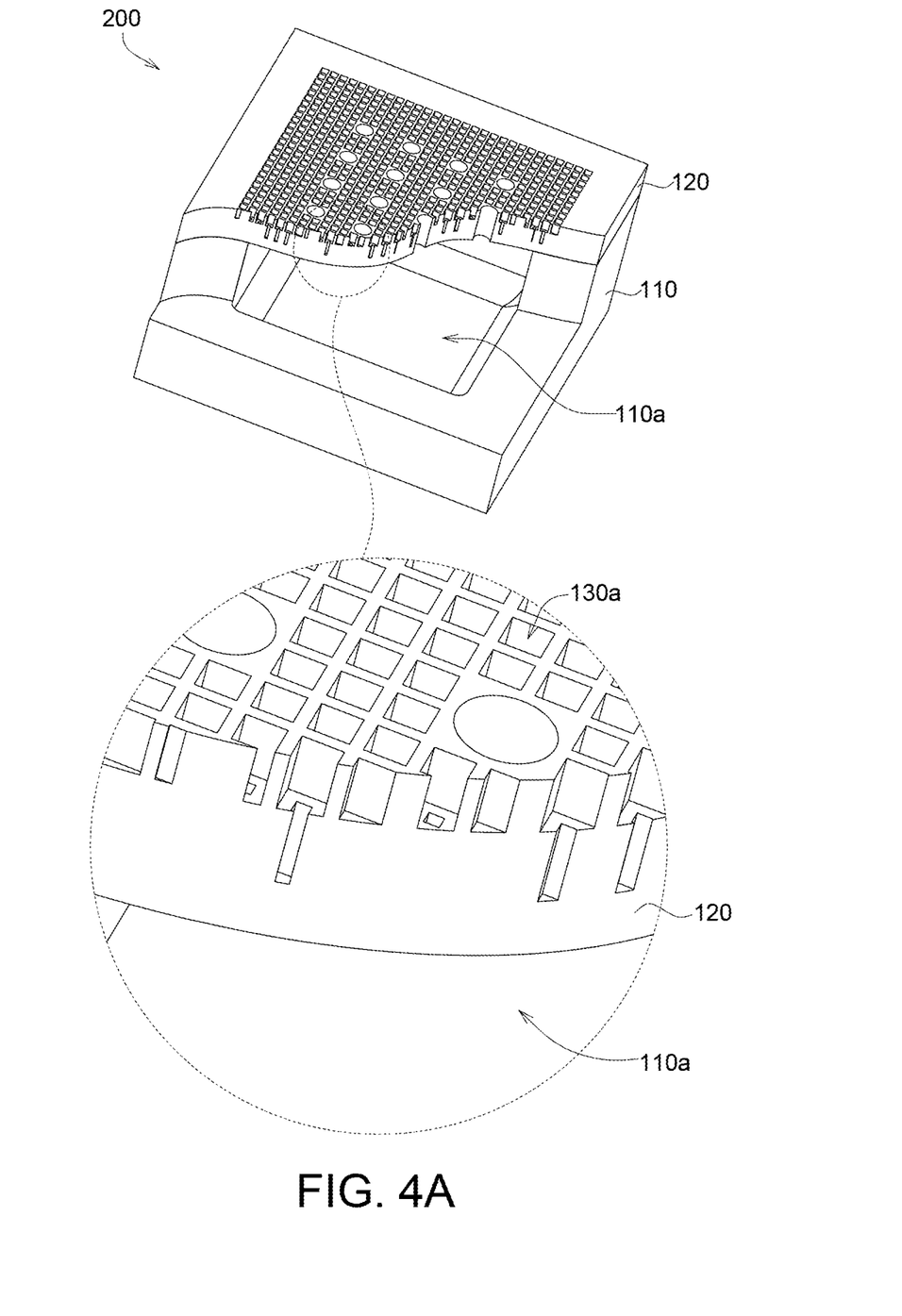
FIG. 4A is a schematic diagram of an infrared sensor according to an embodiment of the disclosure.
Figure 4B:
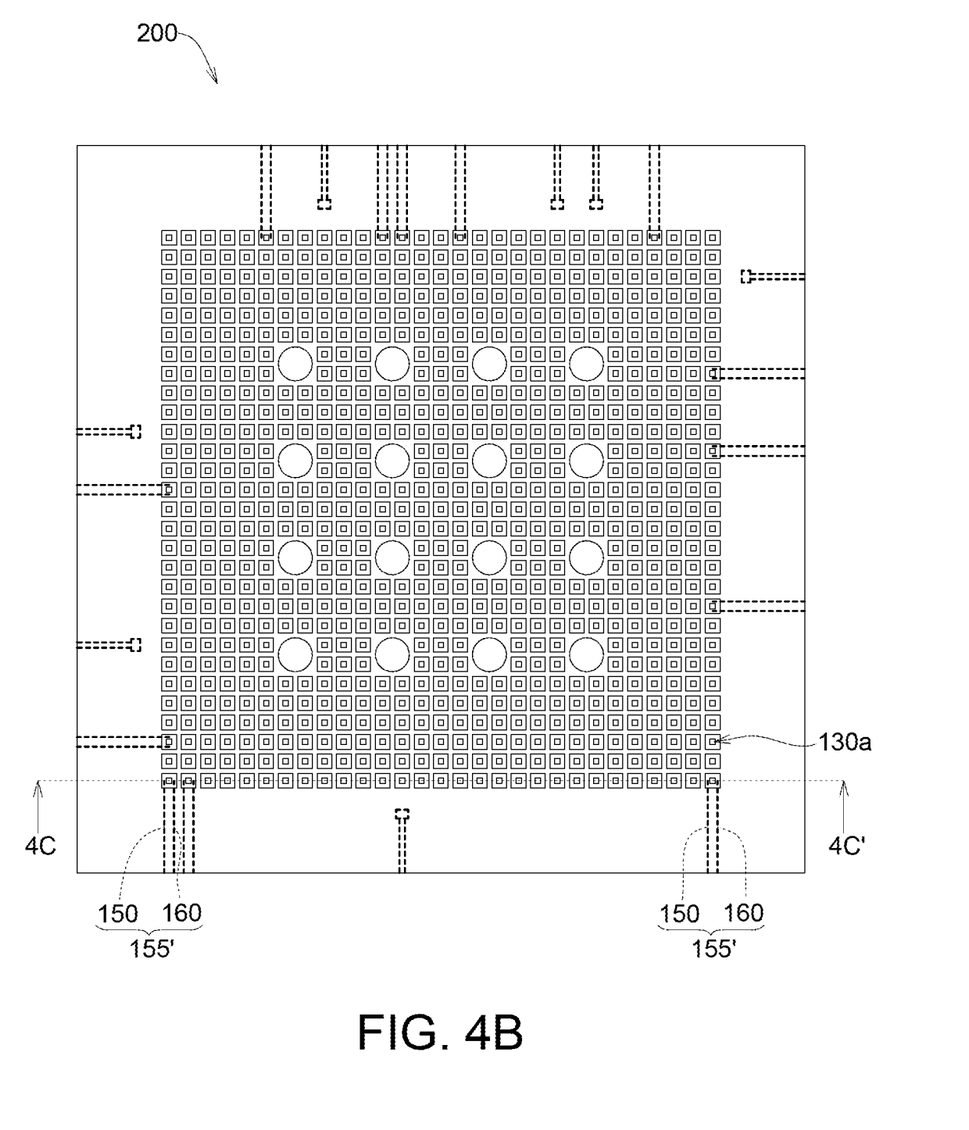
FIG. 4B is a partial top view of the infrared sensor of FIG. 4A.
Figure 4C:
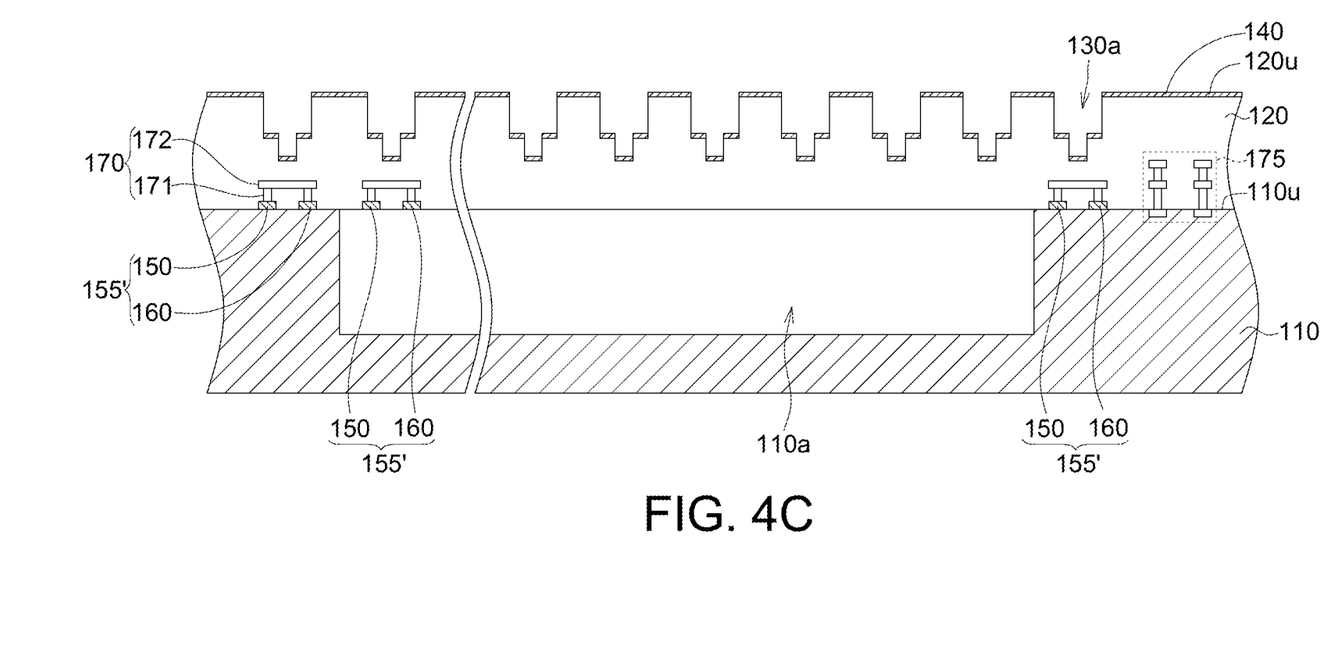
FIG. 4C is a cross-sectional view along a direction 4C-4C' of the infrared sensor of FIG. 4B.

Refer to FIGS. 4A~4C. FIG. 4A is a schematic diagram of an infrared sensor 200 according to an embodiment of the disclosure. FIG. 4B is a partial top view of the infrared sensor 200 of FIG. 4A. FIG. 4C is a cross-sectional view along a direction 4C-4C' of the infrared sensor 200 of FIG. 4B.

The infrared sensor 200 includes a substrate 110, an infrared absorption layer 120, at least one concave 130a, a thermal conduction layer 140, at least one thermoelectric element 155' and a semiconductor structure layer 170. The infrared sensor 200 of the present embodiment of the disclosure has similar technical features with the infrared sensor 100 except that the infrared sensor 200 omits the penetrating portions 120a and has more thermoelectric elements 155'.

As indicated in FIGS. 4B and 4C the infrared sensor 200 includes multiple sets of thermoelectric elements 155'. One end of each thermoelectric element 155' is adjacent to a corresponding concave 130a. Since the penetrating portions 120a are omitted, the other ends of the multiple sets of thermoelectric elements 155' can extend outwardly to the processor in a radial pattern (not illustrated).

Figure 5A:
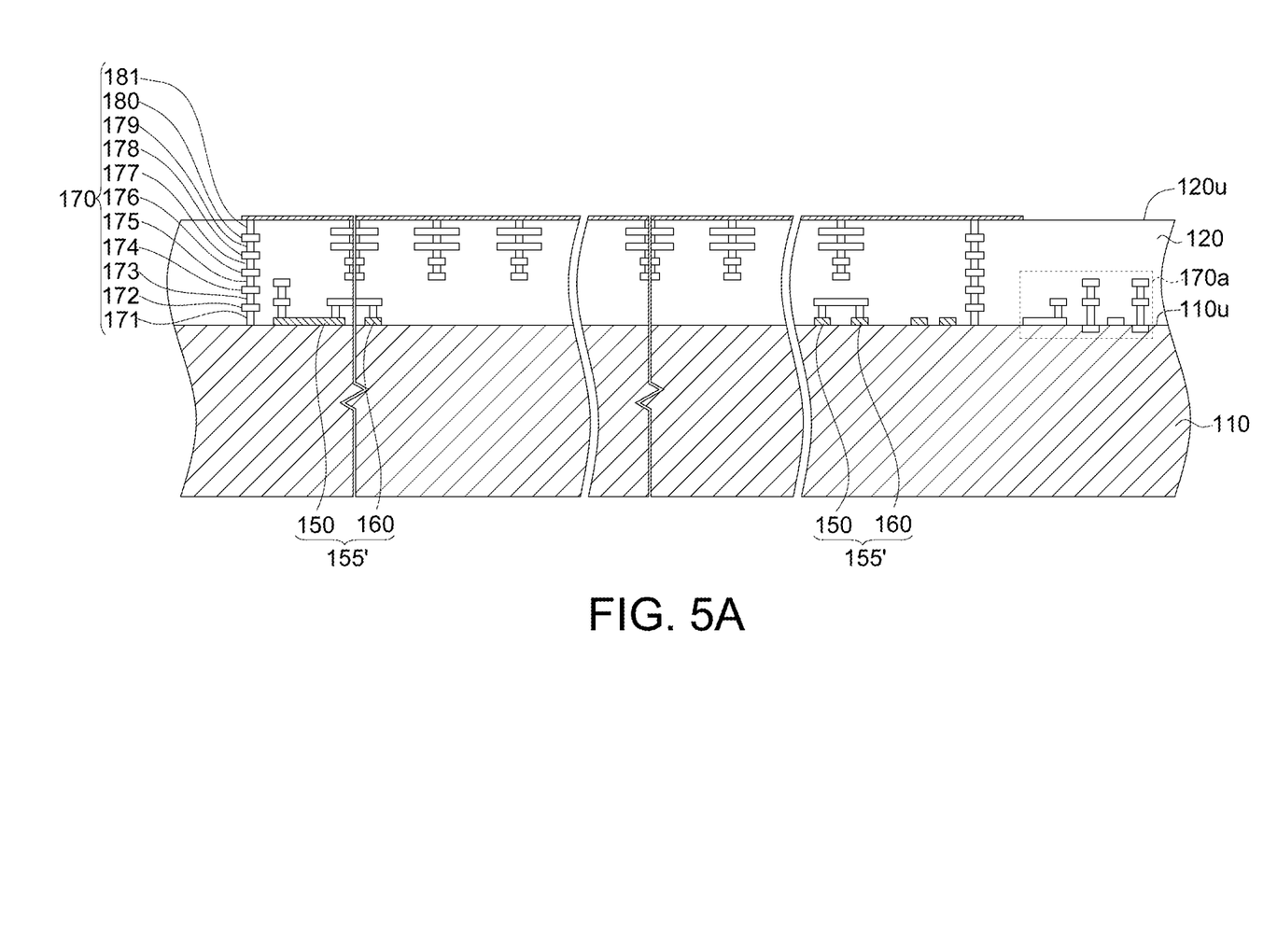
FIGS. 5A~5C are manufacturing processes of the infrared sensor of FIG. 1C.
Figure 5B:
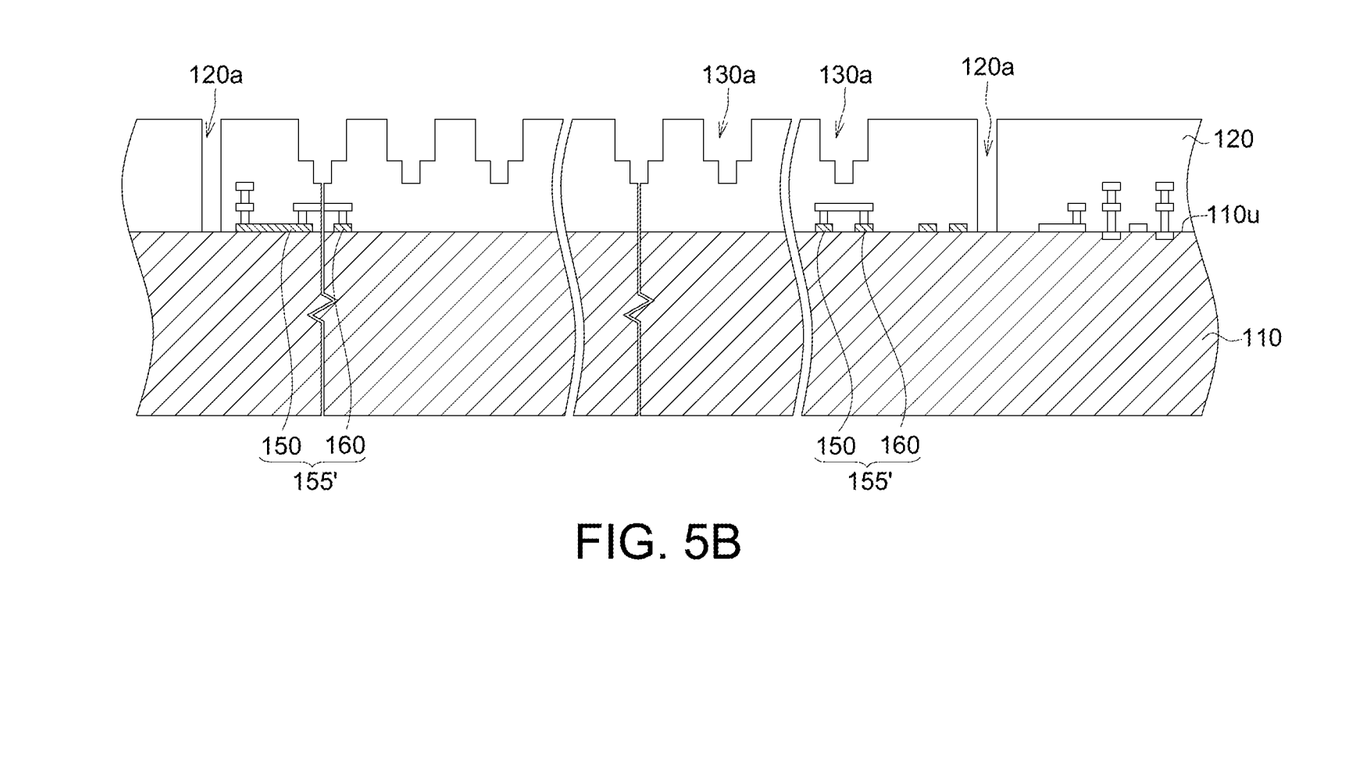
Figure 5C:
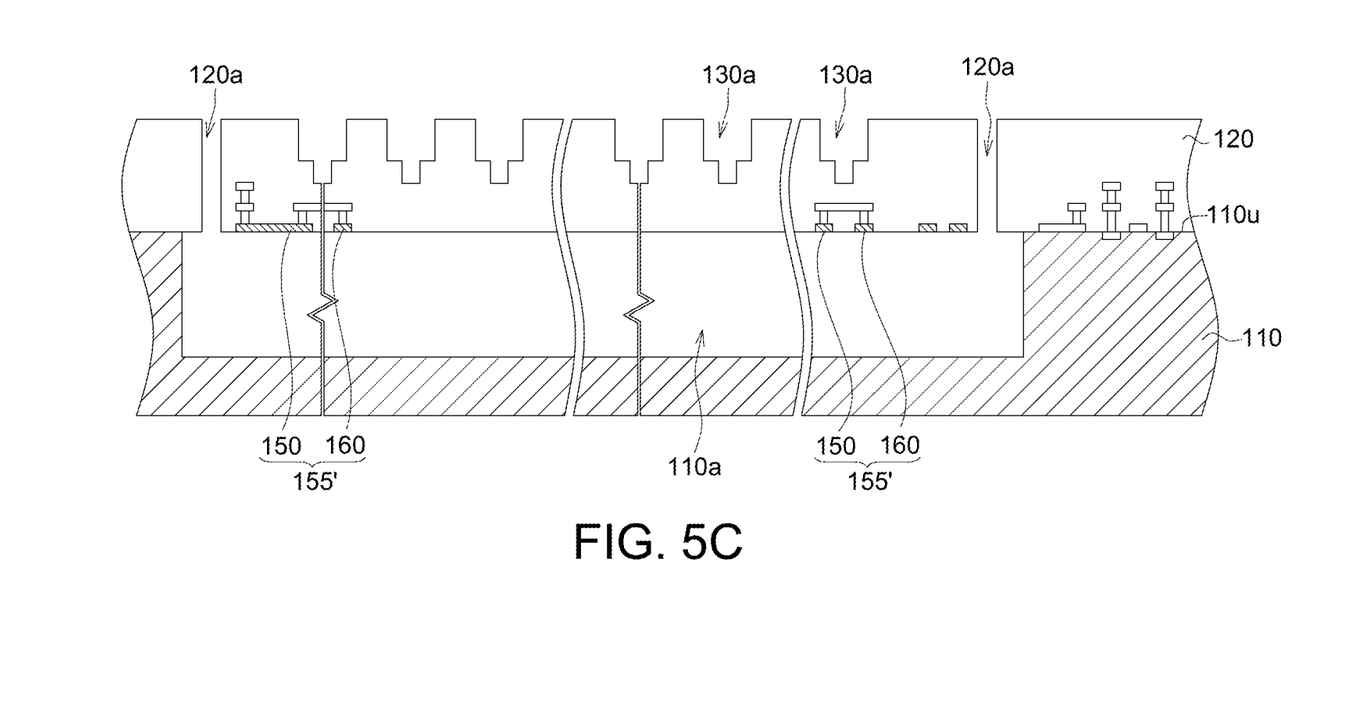

Referring to FIGS. 5A~5C, manufacturing processes of the infrared sensor 100 of FIG. 1C are illustrated.

As indicated in FIG. 5A, a substrate 110, an infrared absorption layer 120, a thermoelectric element 155' and a semiconductor structure layer 170 are provided, wherein the infrared absorption layer 120 is formed on the upper surface 110u of the substrate 110 and has a sensing surface 120u; the semiconductor structure layer 170 is embedded in the infrared absorption layer 120; the thermoelectric element 155' is formed on the upper surface 110u of the substrate 110. The semiconductor structure layer 170 includes at least one first conducting hole 171, a first conducting layer 172, at least one second conducting hole 173, a second conducting layer 174, at least one third conducting hole 175, a third conducting layer 176, at least one fourth conducting hole 177, a fourth conducting layer 178, at least one fifth conducting hole 179, a fifth conducting layer 180 and at least one sixth conducting hole 181. Two adjacent conducting layers can be connected through the conducting hole between the two adjacent conducting layers.

In terms of the manufacturing process, the thermoelectric element 155' and the semiconductor structure layer 170 can be formed on the upper surface 110u of the substrate 110 in a semiconductor manufacturing process (such as a lithography manufacturing process), and then the infrared absorption layer 120 covering the semiconductor structure layer 170 and the thermoelectric element 155' can be formed in a manufacturing process using a coating technology or a printing technology.

As indicated in FIG. 5B, at least one concave 130a and at least one penetrating portions 120a are formed in the same manufacturing process using an etching technology; the concave 130a and the penetrating portion 120a extend towards the substrate 110 from the sensing surface 120u of the infrared absorption layer 120; the penetrating portion 120a surrounds the concave 130a. The concave 130a does not extend to the connection member 1721 of the first conducting layer 172, so that the connection member 1721 can be maintained and can remain the state of being electrically connected to the connection member 1721.

As indicated in FIG. 5B, the penetrating portions 120a pass through a first conducting hole 171, a portion of the first conducting layer 172, a second conducting hole 173, a portion of the second conducting layer 174, a third conducting hole 175, a portion of the third conducting layer 176, a fourth conducting hole 177, a portion of the fourth conducting layer 178, a fifth conducting hole 179, a portion of the fifth conducting layer 180 and a sixth conducting hole 181 of the semiconductor structure layer 170, and extend to the upper surface 110u of the substrate 110.

Since the penetrating portions 120a expose the substrate 110, in subsequent steps, an etching liquid or an etching gas can remove partial materials of the substrate 110 through the penetrating portions 120a. In another embodiment, the concave 130a and the penetrating portions 120a are formed in two different manufacturing processes respectively.

As indicated in FIG. 5C, a cavity 110a can be formed using an etching technology through the penetrating portions 120a, wherein the cavity 110a extends towards the interior of the substrate 110 from the penetrating portions 120a. The penetrating portions 120a provide a channel allowing the etching liquid or etching gas to pass through and remove partial materials of the substrate 110 to form the cavity 110a.

Then, the thermal conduction layer 140 of FIG. 1C is formed on at least one portion of the wall surface of the concave 130a and at least one portion of the sensing surface 120u of the infrared absorption layer 120.

The manufacturing process of the infrared sensor 200 of FIG. 4C is similar to that of the infrared sensor 100 except that no penetrating portions 120a need to be formed in the manufacturing process of the infrared sensor 200.

As disclosed above, with the design of the concave, the infrared sensor has better absorption rate of the infrared energy, and accordingly shortens the response time and reduces the SNR. In another embodiment, with the design of the concave and the thermal conduction layer, the infrared sensor has much higher absorption rate of the infrared energy, and greatly shortens the response time and reduces the SNR. In other embodiments, the cavity of the substrate can reduce the thermal conductivity of the substrate, such that the infrared energy (heat) of the infrared absorption layer will not be transferred to the exterior too quickly, and the reading of the temperature value will not be lower or too much lower than the actual temperature of the object under test.

While the disclosure has been described by way of example and in terms of the preferred embodiment (s), it is to be understood that the disclosure is not limited thereto. On the contrary, it is intended to cover various modification and similar arrangements and procedures, and the scope of the appended claims therefore should be accorded the broadest interpretation so as to encompass all such modification and similar arrangements and procedures.

What is claimed is:

1. An infrared sensor, comprising:
    a substrate;
    an infrared absorption layer formed on the substrate and having a sensing surface; and
    a concave extending towards the substrate from the sensing surface of the infrared absorption layer;
    wherein the concave comprises a first groove and a second groove, the first groove extends to the second groove from the sensing surface, the second groove extends towards the substrate from the first groove, and the first groove has a diameter different from that of the second groove.

2. The infrared sensor according to claim 1, further comprising:
    a thermal conduction layer formed on a wall surface of the concave.

3. The infrared sensor according to claim 1, comprising a plurality of the concaves.

4. The infrared sensor according to claim 1, wherein the diameter of the first groove is larger than that of the second groove.

5. The infrared sensor according to claim 1, further comprising:
    a thermal conduction layer formed on a bottom wall of the first groove and a bottom wall of the second groove.

6. The infrared sensor according to claim 1, wherein the substrate has a cavity extending towards an interior of the substrate from an upper surface of the substrate.

7. The infrared sensor according to claim 6, wherein the infrared absorption layer has a penetrating portion extending to the cavity from the sensing surface and surrounding the concave.

8. The infrared sensor according to claim 1, further comprising:
    a thermoelectric element formed on the substrate, wherein one end of the thermoelectric element is adjacent to the concave.

9. The infrared sensor according to claim 8, wherein the thermoelectric element comprises:
    a first thermosensitive line formed on the substrate, wherein one end of the first thermosensitive line is adjacent to the concave;
    a second thermosensitive line formed on the substrate, wherein one end of the second thermosensitive line is adjacent to the concave; and
    wherein the infrared sensor comprises a connection member formed in the infrared absorption layer for connecting the one end of the first thermosensitive line to the one end of the second thermosensitive line.

10. A manufacturing method of an infrared sensor, comprising:
    providing a substrate and an infrared absorption layer, wherein the infrared absorption layer is formed on the substrate and has a sensing surface; and
    forming a concave extending towards the substrate from the sensing surface of the infrared absorption layer;
    wherein the concave comprises a first groove and a second groove, the first groove extends to the second groove from the sensing surface, the second groove extends towards the substrate from the first groove, and the first groove has a diameter different from that of the second groove.

11. The manufacturing method according to claim 10, further comprising:
    forming a penetrating portion extending to the substrate from the sensing surface and surrounding the concave.

12. The manufacturing method according to claim 10, further comprising:
    forming a cavity extending towards an interior of the substrate from an upper surface of the substrate.

13. The manufacturing method according to claim 10, further comprising:
    forming a penetrating portion extending to the substrate from the sensing surface; and
    forming a cavity through the penetrating portion, wherein the cavity extends towards an interior of the substrate from the penetrating portion.

* * * * *